United States Patent
Hirose et al.

(10) Patent No.: US 6,618,539 B2
(45) Date of Patent: Sep. 9, 2003

(54) HEATER MODULE AND OPTICAL WAVEGUIDE MODULE

(75) Inventors: Yoshiyuki Hirose, Itami (JP); Tadashi Tomikawa, Itami (JP); Hirohisa Saito, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/961,191

(22) Filed: Sep. 24, 2001

(65) Prior Publication Data

US 2002/0057884 A1 May 16, 2002

(30) Foreign Application Priority Data

Sep. 25, 2000 (JP) .................................. P2000-290710

(51) Int. Cl.[7] ................................................ G02B 6/00
(52) U.S. Cl. .......................................... 385/137; 385/92
(58) Field of Search ........................ 385/92, 94, 134, 385/137, 89, 88

(56) References Cited

U.S. PATENT DOCUMENTS

| 3,323,886 A | 6/1967 | Hays |
| 5,288,301 A | 2/1994 | Rowe et al. |
| 5,812,716 A | * 9/1998 | Ohishi .......................... 385/92 |
| 5,818,564 A | 10/1998 | Gray et al. |

FOREIGN PATENT DOCUMENTS

| EP | 0603411 A1 | 6/1994 |
| EP | 0636909 A1 | 2/1995 |
| JP | 7-248425 | 9/1995 |
| JP | 10-123340 | 5/1998 |

OTHER PUBLICATIONS

Takasugi et al., "Study on Reliability of Arrayed Waveguide Grating Modules", Proceedings of the General Meeting in Electronics, the Institute of Electronics Information and Communication Engineers, Mar. 1999, p. 275, XP002945023.

* cited by examiner

*Primary Examiner*—Euncha Cherry
(74) *Attorney, Agent, or Firm*—McDermott, Will & Emery (57) ABSTRACT

To provide a heater module which can improve the temperature uniformity in an optical waveguide while keeping the power consumption and the thickness of the optical waveguide module. A heater module 20 in accordance with the present invention is a heater module 20 for heating an optical waveguide device 12 so as to regulate its temperature; and comprises a heat-generating circuit 22 adapted to generate heat when energized, and a heat-transmitting section 21 disposed on the upper face of the heat-generating circuit 22 and formed with a recessed groove portion for mounting the optical waveguide device 12. When the optical waveguide device 12 is mounted on the bottom face of the heat-transmitting section 21 formed with the recessed groove section, the optical waveguide device 12 can be heated not only from its bottom face, but also from its side faces by edge parts constituting the recessed groove portion, whereby the temperature uniformity can be enhanced.

32 Claims, 7 Drawing Sheets

HEATER MODULE AND OPTICAL WAVEGUIDE MODULE

BACKGROUND OF THE INVENTION

1. Field of the Invention

The present invention relates to a heater module for heating an optical waveguide device so as to regulate the temperature of the optical waveguide device, and an optical waveguide device equipped with the same.

2. Related Background Art

If an optical waveguide module has a large temperature distribution within an optical waveguide device, the size of the optical waveguide will vary due to differences in thermal expansion of its substrate depending on locations, thereby damaging its wavelength selectivity and switching characteristics. Therefore, an uniformity in temperature is required within the optical waveguide device.

As a device for regulating the temperature of optical waveguide devices, thermoelectric cooling module and heaters have conventionally been utilized. Since it is necessary for an optical waveguide module to draw thereinto an optical fiber used for transmitting optical signals with respect to external devices, hermetic sealing is difficult at the drawing portion. Therefore, it is impossible for thermoelectric cooling module to secure their reliability, whereby heaters are often used as a temperature-regulating device. In a heater, a heat-generating circuit (resistance) adapted to generate heat when energized is provided within an insulating layer, whereby the heat from the heat-generating circuit is transmitted to the optical waveguide device by way of the insulating layer.

Conventionally, ceramics heaters made of alumina having a relatively low thermal conductivity (thermal conductivity of 20 W/mK) and the like have often been used. However, tendencies toward larger capacities and higher-speed communications have nowadays become remarkable, in particular, in the field of optical communications. Recently, along with the shift to D-WDM (Dense Wavelength Division Multiplexing), optical waveguide devices having large areas have come into use. Further, there has been an increasing demand for multiplexing a greater number of signals than those conventionally multiplexed for a certain frequency width, thereby enhancing the demand for uniformity in temperature. Hence, it is desired that the uniformity in temperature within the optical waveguide device be further improved (to become $\pm 0.5°$ C. or less).

In order to satisfy such a demand for uniformity in temperature of the optical waveguide device, two methods have currently been under consideration. The first method is one using a heat spreader employing a Cu alloy or the like having a favorable thermal conductivity. It is a method in which the heat generated by an alumina heater is once uniformly dispersed by the heat spreader and then is transmitted to the optical waveguide device, so as to improve the uniformity in temperature. The second method is one in which the heater itself is formed from AlN or the like having a thermal conductivity (thermal conductivity of 170 W/mK) which is about 10 times that of conventionally used alumina, so that the heat generated by the heater is uniformly dispersed by the heater itself and then is transmitted to the optical waveguide device, whereby the uniformity in temperature is improved. When these methods are employed, the temperature distribution of the optical waveguide device can be made $\pm 0.5°$ C. or less.

SUMMARY OF THE INVENTION

However, demands for D-WDM have recently been becoming severer in a drastic manner, whereby further multiplexing is desired. As a consequence, a temperature uniformity higher than that conventionally achieved is required for optical waveguide devices. Further, photonic networks making full use of optical switching and the like without using electric devices at all have been under consideration. For realizing them, devices using new materials such as $LiNbO_3$ and resin waveguides, which are different from conventional quartz and silica, have been under consideration as optical waveguide devices. For these devices, a temperature uniformity severer than that conventionally demanded is required, and there is a case where a temperature uniformity of $\pm 0.1°$ C. or less is required for an optical waveguide device.

Figure 7:
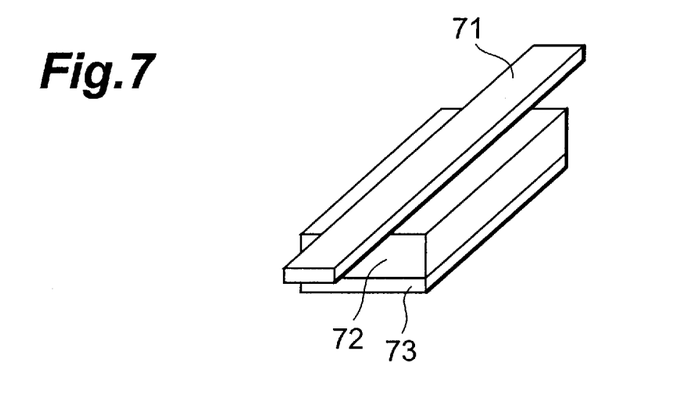
FIG. 7 is a view showing a conventional heater module.

In order to overcome such problems, as shown in FIG. 7, an attempt to realize a temperature uniformity of $\pm 0.1°$ C. or less was carried out by utilizing the fact that the temperature uniformity of an optical waveguide device 71 improves when the thickness of a ceramics heater 73 or the thickness of a heat spreader 72 is enhanced. In this case, though the temperature uniformity in the optical waveguide device 71 was maintained in its surface bonded to the ceramics heater 73 or heat spreader 72, the surface opposite from the one bonded to the ceramics heater 73 or heat spreader 72 was exposed to an ambient temperature, whereby the optical waveguide device 71 was cooled, thus failing to realize a temperature uniformity of $\pm 0.1°$ C. or less.

Figure 8:
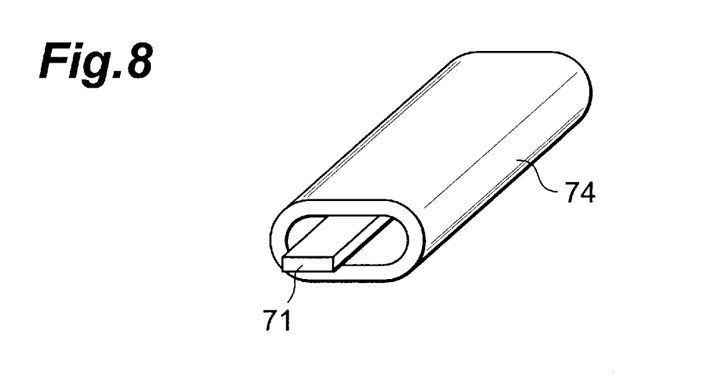
FIG. 8 is a view showing a conventional heater module.

In order to prevent the upper part of the optical waveguide device 71 from being cooled, there maybe considered a method in which the optical waveguide device 71 is heated by a heater from both upper and lower faces of the optical waveguide device 71, or a method in which the heater for heating is not constituted by ceramics but by a silicone 74 or polyimide heater, which can be bent freely as shown in FIG. 8, and the heater is processed into a tubular form having a center part at which the optical waveguide device 71 is installed.

However, the above-mentioned methods heat not only the optical waveguide device 71 but also the whole optical module, thereby being problematic in that the power consumption increases to about two times or more that in the case where heating is effected from only the lower face of the optical waveguide device 71. Also, they are problematic in that the optical waveguide module inevitably increases its thickness. While an optical waveguide module is required to have a thickness of about 10 mm, which is typical as a module other than the optical waveguide module, the thickness of the optical waveguide module becomes about 20 to 30 mm in the above-mentioned methods. Therefore, in an apparatus equipped with the optical waveguide module, design rules for designing an apparatus constituted by other devices alone are not applicable, so that a special design is necessary, whereby not only the efficiency in designing and the cost of design, but also the cost of the whole apparatus increases.

Therefore, it is an object of the present invention to provide a heater module which can improve the temperature uniformity in an optical waveguide while keeping the power consumption and the thickness of the optical waveguide module by overcoming the problems mentioned above, and an optical waveguide module equipped therewith.

The heater module in accordance with the present invention is a heater module for heating an optical waveguide device so as to regulate a temperature of the optical waveguide device, the heater module comprising a heat-generating circuit adapted to generate heat when energized; and a heat-transmitting section disposed on an upper face of the heat-generating circuit and formed with a recessed groove portion for mounting the optical waveguide device.

Figure 9:
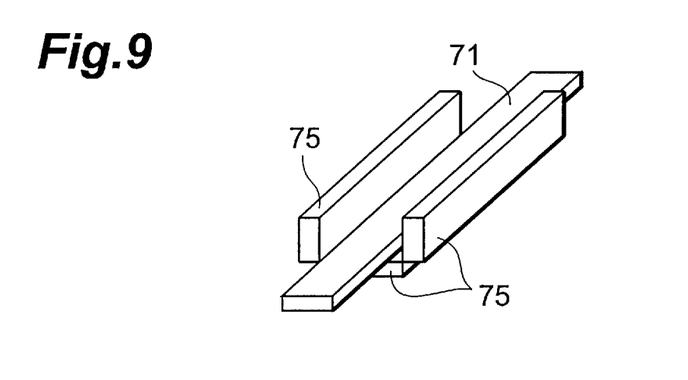
FIG. 9 is a view showing a conventional heater module.

In the present invention, the heat-transmitting section for heating an optical waveguide device is formed with a recessed groove portion, and the optical waveguide device is mounted in this recessed groove portion. The inventors have found that such a configuration makes it possible to heat the optical waveguide device not only from its bottom face but also from its side faces by way of edge parts constituting the recessed groove portion, whereby the temperature uniformity can be enhanced. Since the heat is transmitted from the edge parts of the recessed groove portion formed in the integral heat-transmitting section in the configuration of the present invention, it is not necessary to provide respective heaters 75 for generating heat at the bottom and side faces as shown in FIG. 9. Also, since the optical waveguide device can be mounted so as to be inserted into the recessed groove portion formed in the heat-transmitting section, no heat-transmitting section for heating the upper face of the optical waveguide device is necessary, whereby a simple configuration can realize a heater module capable of enhancing the temperature uniformity. As a consequence, the thickness of the optical waveguide module using the optical waveguide device can be kept on a par with that in the case where the optical waveguide device is simply mounted on the heat-transmitting section.

In the heater module, the heat-transmitting section may be constituted by AlN ceramics.

When the heat-transmitting section is thus constituted by AlN ceramics having a high thermal conductivity, the temperature uniformity of the heated optical waveguide device can further be enhanced.

Preferably, in the heater module, an insulating layer is disposed between the heating circuit and the heat-transmitting section.

The optical waveguide module in accordance with the present invention comprises the above-mentioned heater module, an optical waveguide device mounted in a recessed groove portion formed in the heat-transmitting section, and a housing accommodating the heater module and the optical waveguide device.

When an optical waveguide module for heating an optical waveguide device is constituted by using the above-mentioned heater module as such, the temperature uniformity of the optical waveguide device can be enhanced, and the optical waveguide module can be realized by a simple configuration, whereby the thickness of the optical waveguide module can be kept on a par with that in the case where the optical waveguide device is simply mounted on the heat-transmitting section.

Preferably, a gaseous medium is interposed in a space defined between an edge part of the recessed groove portion and the optical waveguide device, and the upper face of the edge part constituting the recessed groove portion is higher than the upper face of the optical waveguide device mounted on the bottom face of the recessed groove portion, or has a level difference not greater than 0.1 mm with respect to the upper face of the optical waveguide device or not greater than $\frac{1}{10}$ of the height of the optical waveguide device.

The edge part of the recessed groove portion acts to transmit the heat, which is transmitted to the heat-transmitting section, to the optical waveguide device. The heat from the edge part is transmitted by way of the gaseous medium interposed between the optical waveguide device and the edge part. When the upper face of the edge part is lower than the upper face of the optical waveguide device, the heat is transmitted to the optical waveguide device up to the height of the upper face of the edge part but not to its portion higher than the edge part. In this case, the upper face of the optical waveguide device is cooled by the ambient temperature. As a result of simulations of the relationship between the height of the edge part and the temperature uniformity, it has been found that, in the case where the upper face of the edge part is higher than the upper face of the optical waveguide device or where the upper face of the optical waveguide device is higher than the edge part, a desirable temperature uniformity (±0.1° C. or less) can be realized when their difference is not greater than 0.1 mm or not greater than $\frac{1}{10}$ of the height of the optical waveguide device.

Preferably, a gaseous medium is interposed in a space defined between an edge part of the recessed groove portion and the optical waveguide device, and the space defined between the edge part of the recessed groove portion and the optical waveguide device has a width of at least 0.02 mm but not greater than 1.0 mm.

If the width of the space between the edge part and the heat-transmitting section is shorter than 0.02 mm, a portion where the heat-transmitting section and the optical waveguide device partly come into contact with each other will occur due to problems in the processing accuracy of the heat-transmitting section, whereby the temperature uniformity of the optical waveguide device cannot be secured. If the width of the space between the edge part and the heat-transmitting section is greater than 1.0 mm, heat cannot efficiently be transmitted to side faces of the optical waveguide device when convection occurs within the optical waveguide module due to partial temperature differences and the like, whereby the temperature uniformity cannot be secured. Therefore, it is preferred that the width of the space between the edge part and the heat-transmitting section be at least 0.02 mm but not greater than 1.0 mm. Further, according to the structure of the optical waveguide module, it is desirable that the width of the space be 0.5 mm or less in order to keep the convection from influencing the space.

The optical waveguide module may further comprise a resin interposed in a space defined between the edge part and the optical waveguide device.

When a resin is interposed in a space defined between the edge part and the optical waveguide device as such, the resin can transmit heat from the heat-transmitting section to the optical waveguide device.

In the optical waveguide module, the resin may be composed of a grease-like material.

When a grease-like resin is used as such, no thermal stress acts on side faces of the optical waveguide device. Therefore, even when an optical waveguide susceptible to stress is used, the danger of damaging the optical waveguide device can be lowered.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Preferred embodiments of the optical waveguide module in accordance with the present invention will now be explained in detail with reference to the drawings. In the explanation of the drawings, constituents identical to each other will be referred to with numerals identical to each other without repeating their overlapping descriptions.

Figure 1:
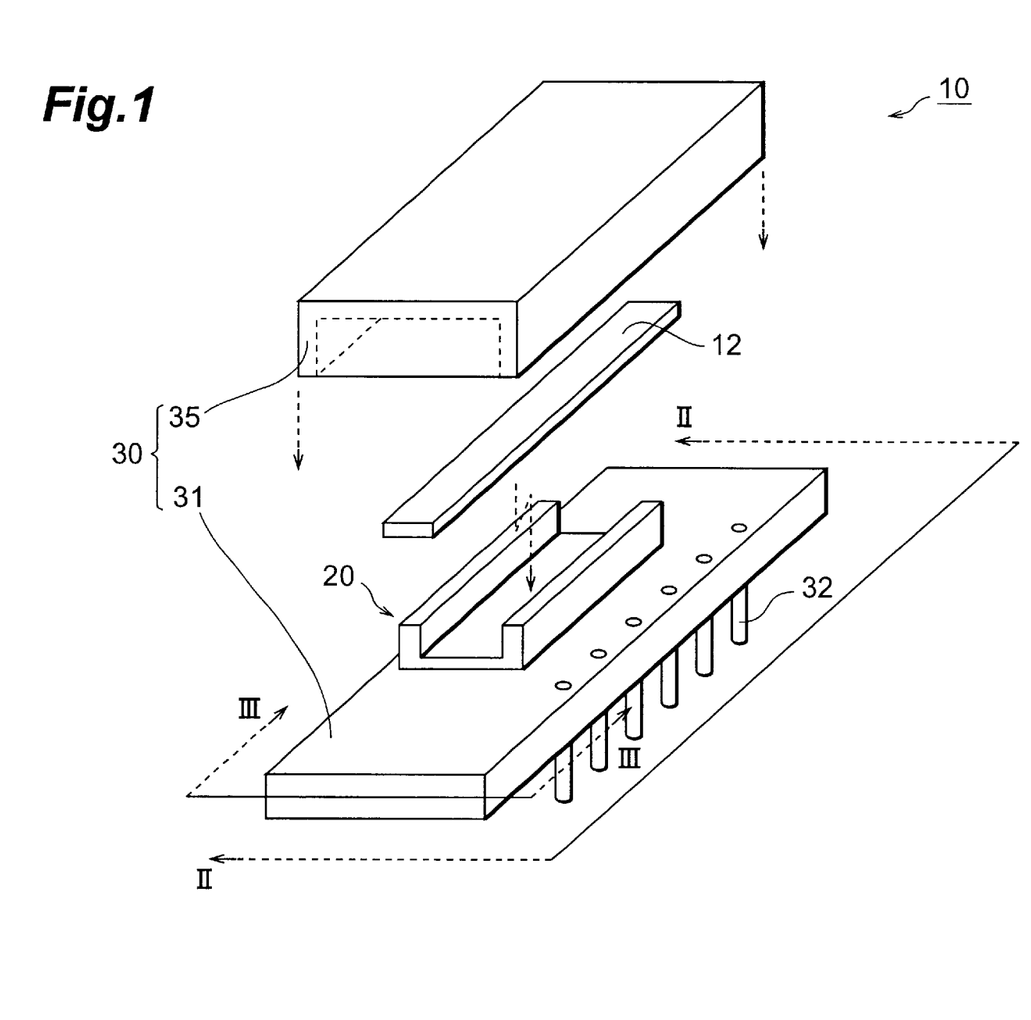
FIG. 1 is an exploded perspective view showing the optical waveguide module in accordance with a first embodiment.
Figure 2:
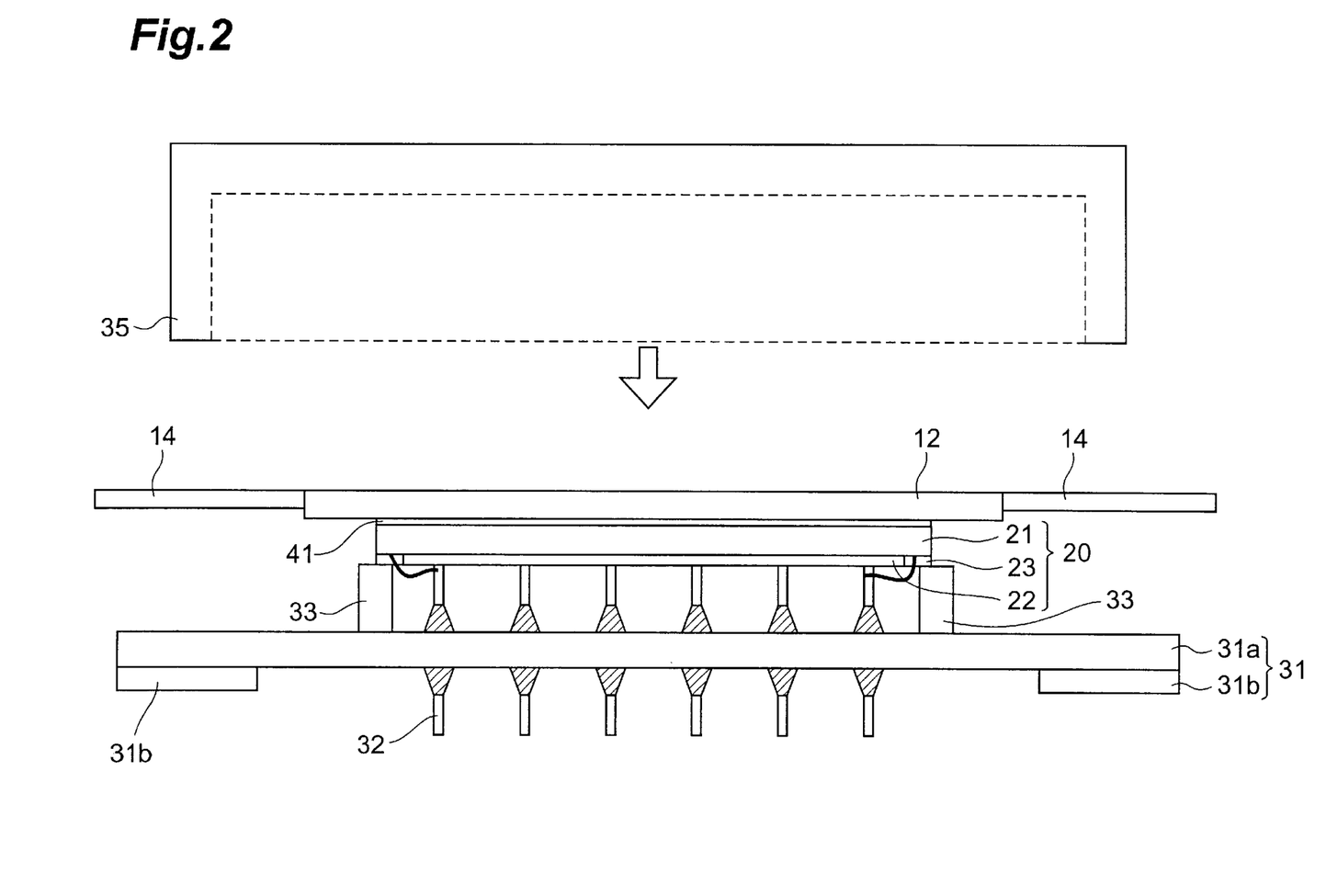
FIG. 2 is a sectional view showing the optical waveguide module in accordance with the first embodiment.
Figure 3:
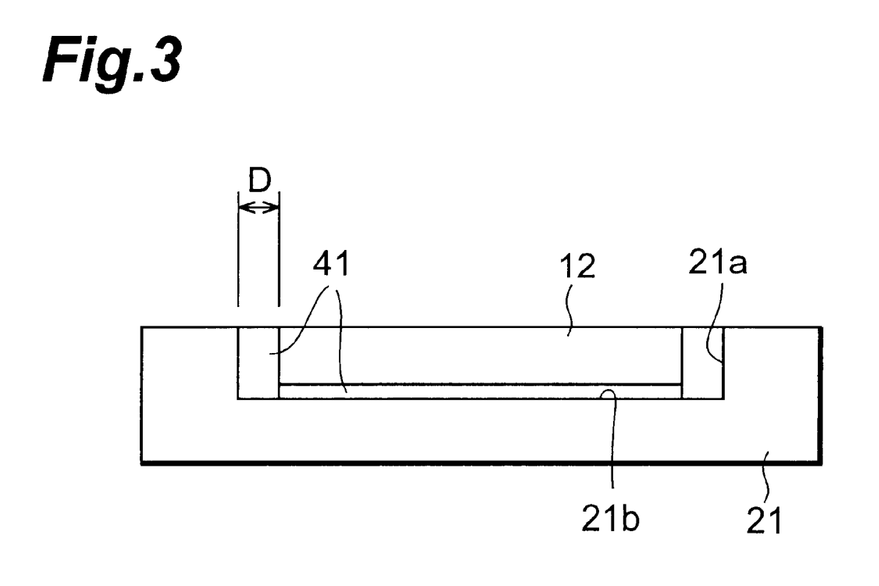
FIG. 3 is a sectional view showing the optical waveguide module in accordance with the first embodiment.
Figure 4:
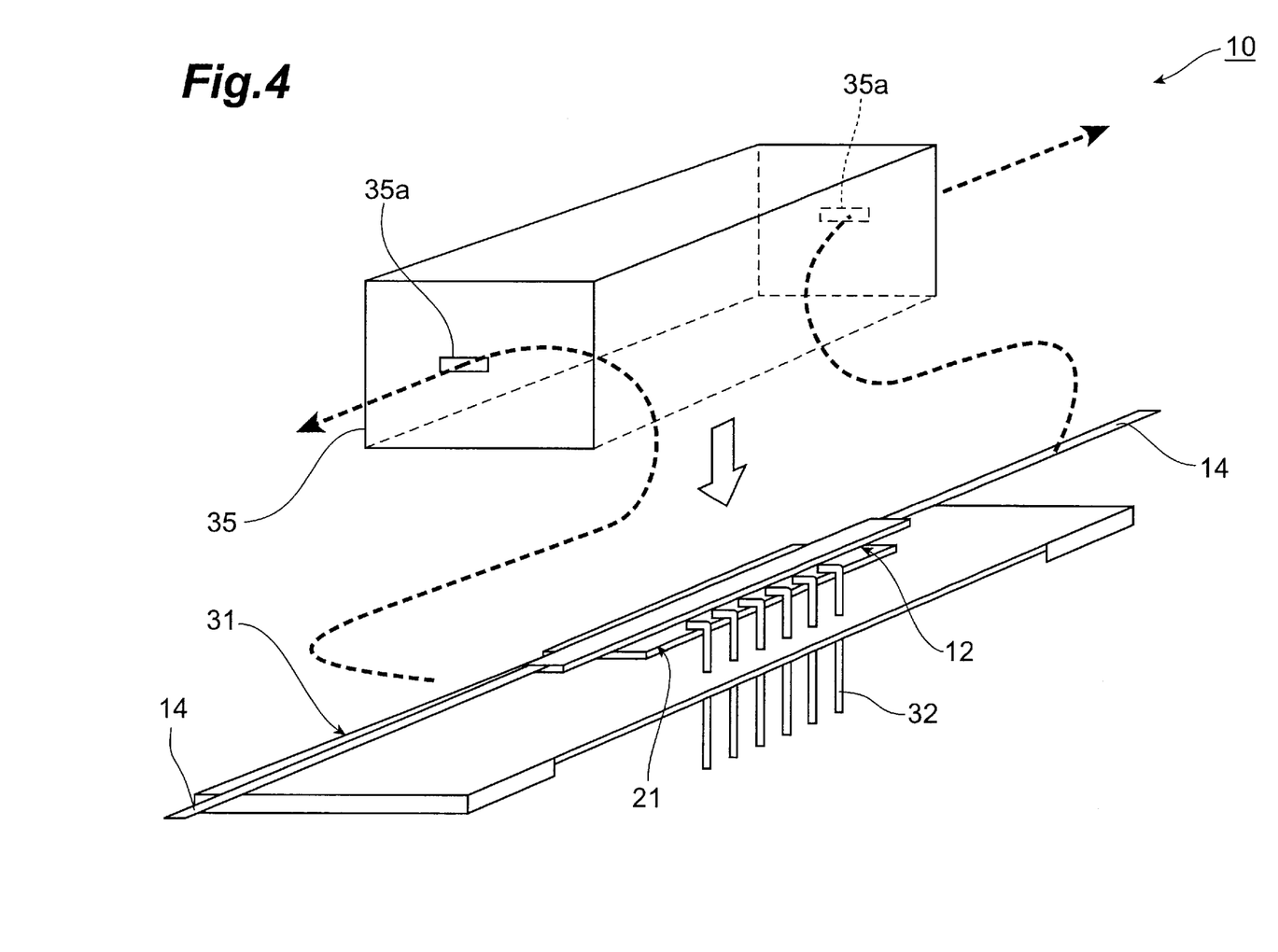
FIG. 4 is an explanatory view for explaining the housing of the optical waveguide module.

FIG. 1 is a perspective view showing the configuration of an optical waveguide module 10 in accordance with a first embodiment, FIG. 2 is a sectional view of the optical waveguide module 10 taken along the II—II direction, FIG. 3 is a sectional view of the optical waveguide module 10 taken along the III—III direction, and FIG. 4 is an explanatory view for explaining a housing 30. The optical waveguide module 10 comprises an optical waveguide device 12 made of quartz with dimensions of 50×10×1 mm, a heater module 20 for heating the optical waveguide device 12, and the housing 30 for accommodating the optical waveguide device 12 and heater module 20.

As shown in FIG. 2, the heater module 20 is constituted by a heat-generating circuit 22, adapted to generate heat when energized, having a resistance of 0.5 to 10 Ω; and a heat-transmitting section 21 disposed on the upper face of the heat-generating circuit 22. The heat-generating circuit 22 is formed from tungsten, molybdenum, silver-palladium, or the like, and electrodes 23 for supplying an electric current to flow through the heat-generating circuit 22 are disposed at both ends of the heat-generating circuit 22. The heat-transmitting section 21 disposed on the upper face of the heat-generating circuit 22 is formed by an AlN ceramics layer 21 having a high thermal conductivity. As shown in FIG. 3, the heat-transmitting section 21 is formed with a recessed groove portion, and the optical waveguide device 12 is mounted on the bottom face 21b of the recessed groove portion so as to be held between edge parts 21a constituting the recessed groove portion. A resin 41 fills the gap between the mounted optical waveguide device 12 and the bottom face 21b of the recessed groove portion, and the gap between the optical waveguide device 12 and each edge part 21a. The heat transmitted from the heat-generating circuit 22 is substantially uniformly dispersed within the AlN ceramics layer 21. As a consequence, the heat is transmitted from the bottom face 21b and edge parts 21a of the recessed groove portion by way of the resin 41, so that the optical waveguide device 12 mounted on the upper face of the AlN ceramics layer 21 is uniformly heated, is whereby the temperature uniformity in the optical waveguide device 12 can be enhanced. Also, since AlN ceramics are highly resistant to humidity, the resistance value of the heat-generating circuit 22 does not change even when continuously used for a long period of time, whereby a high reliability is obtained. Here, a method of making the heater module 20 will be explained. First, with W paste, the heat-generating circuit 22 and the electrodes 23 are printed on a preform sheet of AlN ceramics. Subsequently, the preform sheet of AlN ceramics is applied to the upper face of the heat-generating circuit 22, so as to make a temporarily formed article of the heater module 20. This temporarily formed article is sintered in a nitrogen atmosphere of 1700° C. or higher, so that the recessed groove portion is formed in the AlN ceramics, where by the heater module 20 is accomplished. When mounting the optical waveguide device 12 in the heater module 20, the amount of resin used for bonding the optical waveguide device 12 and the recessed groove portion bottom face 21b to each other is set greater, for example, so that the resin 41 spills over when the optical waveguide device 12 and the heat-transmitting section 21 are bonded to each other, and thus spilled resin 41 is used for filling the spaces between the optical waveguide device 12 and the edge parts 21a of the recessed groove portion. Though the resin 41 used in this embodiment is a silicone resin, an epoxy resin can be used as well. Further, in order to lower the stress acting on the optical waveguide device 12, a part of the resin 41 may be substituted by grease, for example, such that a part contacting to side faces of the optical waveguide device 12 is a grease-like resin.

The housing 30 is constituted by a package substrate 31, to which lead pins 32 for energizing the heat-generating circuit 22 are soldered, for supporting the heater module 20; and a cover 35 for covering the package substrate 31 (see FIG. 1). The whole package has dimensions of 100×50×10 mm. As shown in FIG. 4, two opposing faces of the cover 35 for the housing 30 are formed with insertion ports 35a for inserting an optical fiber 14. The package substrate 31 has a flat sheet 31a to which the lead pins 32 are soldered, and support sheets 31b bonded to both ends of the lower side of the flat sheet 31a (see FIG. 2). When the support sheets 31b are provided as such, excessive loads can be prevented from being exerted on the lead pins 32 when assembling the optical waveguide module 10 into a system board and the like. The cover 35 and the package substrate 31 are bonded to each other by a resin. Though the resin used in this embodiment is a silicone resin which is effective in preventing the deformation from occurring at the time of bonding, an epoxy resin can also be used. The cover 35 and the package substrate 31 are mainly composed of copper-tungsten. Therefore, the housing 30 has a high temperature uniformity, whereby the temperature uniformity in the optical waveguide device 12 can be improved. Similar effects can also be obtained when the housing 30 is mainly composed of cobalt, iron, nickel, alumina, or aluminum nitride. When the housing 30 is mainly composed of a resin or silica glass, which is a highly heat-insulating material, the heat within the housing 30 can be restrained from being emitted to the outside, whereby the temperature of the optical waveguide device 12 can be prevented from decreasing.

In the optical waveguide module 10 in accordance with this embodiment, the heat-transmitting section 21 of the heater module for heating the optical waveguide device 12 is formed with the recessed groove portion, in which the optical waveguide device 12 is mounted. As a consequence, the optical waveguide device 12 is heated from the bottom face 21b and edge parts 21a of the recessed groove portion, whereby the temperature uniformity in the optical waveguide device 12 can be enhanced. When the temperature uniformity in the optical waveguide device 12 was observed with a thermo-viewer under a condition in which the temperature of the heater module 20 was 80° C. and the ambient temperature was 0° C., it was possible to hold the temperature distribution within ±0.1° C. As for the temperature controllability, only a change of ±0.2 or less in temperature was observed even when the ambient temperature was changed over the range of −40 to 70° C., whereby it was found to be less susceptible to the outside temperature. Also, the heater module 20 and the optical waveguide device 12 were less likely to warp, no anisotropy was observed in optical waveguide characteristics, and no problems were found in the insertion loss, switching characteristics and dependence of polarization clue to birefringence occurred.

Since a single heat-generating circuit 22 can heat the optical waveguide device 12 from the edge parts 21a and bottom face 21b, the optical module in accordance with this embodiment can improve the temperature uniformity while saving the power consumption. In an experiment carried out under the above-mentioned condition, the power consumption was 3 W or less.

Figure 5:
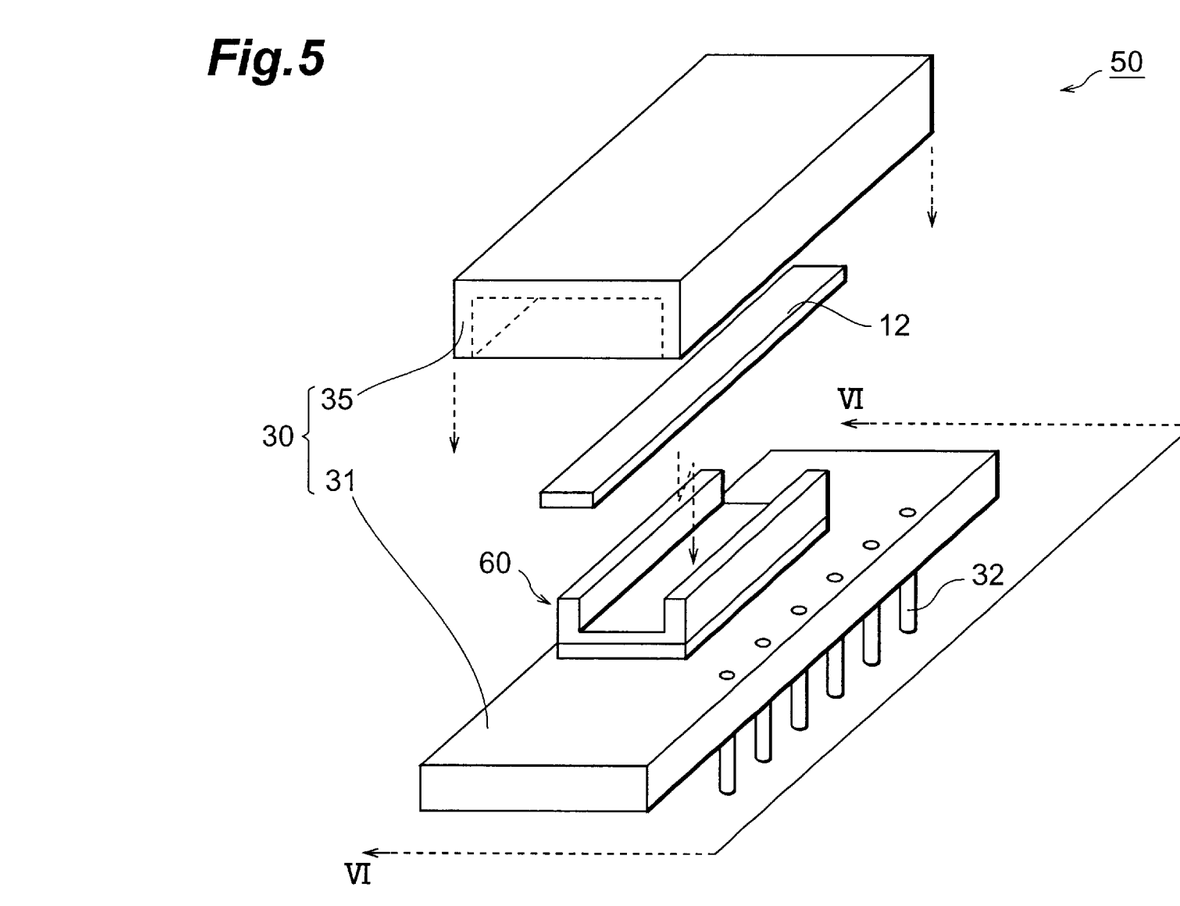
FIG. 5 is an exploded perspective view showing the optical waveguide module in accordance with a second embodiment.
Figure 6:
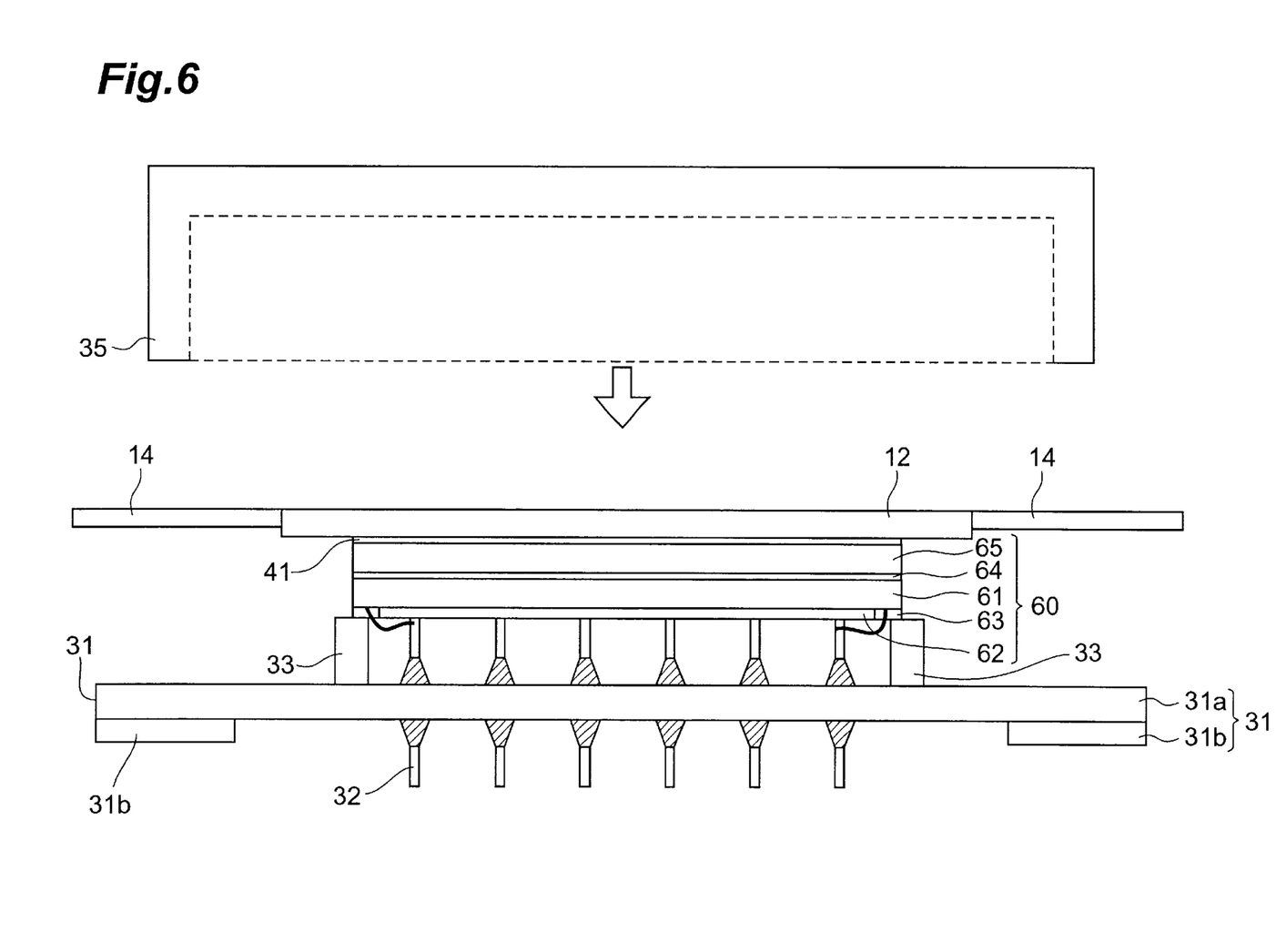
FIG. 6 is a sectional view showing the optical waveguide module in accordance with the second embodiment.

An optical waveguide module 50 in accordance with a second embodiment of the present invention will now be explained. FIG. 5 is a perspective view showing the optical waveguide module 50 in accordance with the second embodiment, and FIG. 6 is a VI—VI sectional view of the optical waveguide module 50. The optical waveguide module 50 in accordance with the second embodiment has a basic configuration identical to that of the optical waveguide module 10 in accordance with the first embodiment but differs therefrom in the configuration of a heater module 60 for heating the optical waveguide device 12.

As shown in FIG. 6, the heater module 60 in the second embodiment has a heat-generating circuit 62 adapted to generate heat when energized, an insulating layer 61 disposed on the upper face of the heating circuit 62, and a heat spreader 65 disposed on the upper face of the insulating layer 61 by way of a resin 64. The heating circuit 62 formed from tungsten, molybdenum, silver-palladium, or the like, and electrodes 63 for supplying an electric current to flow through the heat-generating circuit 62 are disposed at both ends of the heat-generating circuit 62. The insulating layer 61 disposed on the upper face of the heat-generating circuit 62 is made of alumina ceramics, and the heat spreader 65 disposed on the upper face of the insulating layer 61 is made of a Cu alloy. As shown in FIG. 5, the heat spreader 65 is formed with a recessed groove portion, and the optical waveguide device 12 is mounted on the bottom face of the recessed groove portion so as to be held between edge parts constituting the recessed groove portion. The heat transmitted from the heat-generating circuit 62 is substantially uniformly dispersed within the heat spreader 65. As a consequence, to the optical waveguide device 12 mounted on the upper face of the heat spreader 65, the heat is transmitted from its bottom face and edge parts, so that the optical waveguide device 12 is uniformly heated, whereby its temperature uniformity can be enhanced.

As with the optical waveguide module 10 in accordance with the first embodiment, the optical waveguide module 50 having thus configured heater module 60 is effective in enhancing the temperature uniformity in the optical waveguide device 12. Though a ceramics heater in which the insulating layer 61 is made of alumina ceramics is used in this embodiment, other ceramics, e.g., AlN ceramics, may be used as well. Results substantially the same as those of the optical waveguide module 50 in accordance with the second embodiment can also be obtained when silicone rubber or polyimide is used in place of ceramics. Further, the heat spreader 65 is not restricted to the Cu alloy, but may be a metal having a high thermal conductivity such as an Al alloy.

An optical waveguide module in accordance with a third embodiment of the present invention will now be explained. The optical waveguide module in accordance with the third embodiment has a basic configuration identical to that of the optical waveguide module 50 in accordance with the second embodiment, but differs therefrom in that the space between the edge part 21a constituting the recessed groove portion and the optical waveguide device 12 is filled with air instead of the resin 41.

Table 1 shows results of Experiment 1 in which the temperature uniformity in the optical waveguide device in thus configured optical waveguide module was measured while changing the width (corresponding to the width D shown in FIG. 3) of the space between the edge part of the recessed groove portion and the optical waveguide device. Here, the upper face of the optical waveguide device and the upper face of the edge part 21a of the recessed groove portion are supposed to have the same height.

TABLE 1

The heat-transmitting section and the optical waveguide device have the same height.

| | Space width (mm) | Temperature uniformity (° C.) |
|---|---|---|
| Sample 1* | 0.01 | ±0.2 |
| Sample 2 | 0.02 | ±0.1 |
| Sample 3 | 0.1 | ±0.07 |
| Sample 4 | 0.5 | ±0.09 |
| Sample 5 | 1.0 | ±0.1 |
| Sample 6* | 1.5 | ±0.3 |

*indicates Comparative Example.

As can be seen from this table, a temperature uniformity of ±0.1° C. or less can be attained when the width of the space between the edge part 21a of the recessed groove portion and the optical waveguide device is at least 0.02 mm but not greater than 1.0 mm.

Table 2 shows results of Experiment 2 in which the outside of the optical waveguide module in Experiment 1 was forcibly cooled with air at a wind speed of 5 m/s.

TABLE 2

The heat-transmitting section and the optical waveguide device have the same height, with forcible cooling at a wind speed of 5 m/s.

| | Space width (mm) | Temperature uniformity (° C.) |
|---|---|---|
| Sample 7* | 0.01 | ±0.2 |
| Sample 8 | 0.02 | ±0.1 |
| Sample 9 | 0.1 | ±0.07 |
| Sample 10 | 0.5 | ±0.09 |
| Sample 11* | 1.0 | ±0.2 |

*indicates Comparative Example.

As can be seen from this table, a temperature uniformity of ±0.1° C. or less can be attained when the width of the space between the edge part 21a of the recessed groove portion and the optical waveguide device is at least 0.02 mm but not greater than 0.5 mm.

Table 3 shows results of Experiment 3 in which the temperature uniformity in the optical waveguide device in the optical waveguide module in accordance with the third embodiment was measured while changing the height of the edge part 21a of the recessed groove portion and the height of the optical waveguide device relative to each other. Here, the height of the optical waveguide device was set to 1.2 mm, and the width of the space between the optical waveguide device and the edge part 21a of the recessed groove portion was set to 0.1 mm.

TABLE 3

Space width = 0.1 mm, and the height of the optical waveguide device = 1.2 mm.

| | Positional relationship between optical waveguide device and edge part (mm) | Temperature uniformity (° C.) |
|---|---|---|
| Sample 12* | 0.01 | ±0.07 |
| Sample 13 | 0.05 | ±0.07 |
| Sample 14 | 0.12 | ±0.1 |
| Sample 15* | 0.2 | ±0.12 |

*indicates Comparative Example.

As can be seen from this table, in the case where the optical waveguide device is higher than the edge part 21a of the recessed groove portion, a temperature uniformity of ±0.1° C. or less can be achieved when their difference is not greater than 0.1 mm, which is 1/10 of the thickness of the optical waveguide device.

Table 4 shows results of Experiment 4 in which the temperature uniformity in the optical waveguide device in the optical waveguide module in accordance with the third embodiment was measured while changing the height of the edge part 21a of the recessed groove portion and the height of the optical waveguide device relative to each other. Here, the height of the optical waveguide device was set to 0.5 mm, and the width of the space between the optical waveguide device and the edge part 21a of the recessed groove portion was set to 0.1 mm.

TABLE 4

Space width = 0.1 mm, and the height of the optical waveguide device = 0.5 mm.

| | Positional relationship between optical waveguide device and edge part (mm) | Temperature uniformity (° C.) |
|---|---|---|
| Sample 16* | 0.01 | ±0.06 |
| Sample 17 | 0.05 | ±0.06 |
| Sample 18 | 0.1 | ±0.08 |
| Sample 19* | 0.2 | ±0.12 |

*indicates Comparative Example.

As can be seen from this table, in the case where the optical waveguide device is higher than the edge part 21a of the recessed groove portion, a temperature uniformity of ±0.1° C. or less can be achieved when their difference is not greater than 0.1 mm, even if it is not 1/10 of the thickness of the optical waveguide device or less.

Table 5 shows results of Experiment 5 in which the height of the optical waveguide in Experiment 3 was made lower than that of the edge part 21a of the recessed groove portion.

TABLE 5

Space width = 0.1 mm, and the height of the optical waveguide device = 1.2 mm.

| | Positional relationship between optical waveguide device and edge part (mm) | Temperature uniformity (° C.) |
|---|---|---|
| Sample 20 | 0.01 | ±0.07 |
| Sample 21 | 0.05 | ±0.07 |
| Sample 22 | 0.1 | ±0.07 |
| Sample 23 | 0.2 | ±0.07 |

As can be seen from this table, a temperature uniformity of ±0.1° C. or less can be achieved when the edge part 21a of the recessed groove 21a is higher than the optical waveguide device.

Though embodiments of the present invention are explained in detail, the present invention is not restricted to the above-mentioned embodiments.

Though the optical waveguide is made of quartz in the above-mentioned embodiment, it is not limited to one made of quartz. For example, optical waveguide devices made of resins, silica, $LiNbO_3$, and the like may be used as well.

Also, the dimensions of the optical waveguide device can be changed.

Further, the resin used for bonding and the like, and the material used for the housing and the like are not limited to those in the above-mentioned embodiments.

According to the present invention, a recessed groove portion is formed in the heat-transmitting section constituting the heater module, and the optical waveguide device is mounted so as to be inserted in the recessed groove portion, whereby the optical waveguide device is heated from the bottom face and side faces. Therefore, the temperature uniformity in the optical waveguide device can be improved.

Also, since the present invention is not configured so as to heat the whole optical waveguide device, it can lower the power consumption for heating the optical waveguide device. Further, the thickness of the optical waveguide module can be kept on a par with that in the case where the optical waveguide device is simply mounted in the heat-transmitting section.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A heater module for heating an optical waveguide device so as to regulate a temperature of said optical waveguide device, which comprises
    a heat-generating circuit adapted to generate heat when energized; and
    a heat-transmitting section disposed on an upper face of said heat-generating circuit and the optical waveguide device mounted on the heat-transmitting section, characterized in that:
    said heat-transmitting section is formed with a recessed groove portion for mounting said optical waveguide device;
    wherein a gaseous medium or a resin is interposed in a space defined between walls of said recessed groove portion and said optical waveguide device; and wherein an upper face of said walls constituting said recessed groove portion is higher than an upper face of said optical waveguide device mounted on a bottom face of said recessed groove portion, or has a level difference not greater than 0.1 mm with respect to said upper face of said optical waveguide device or not greater than 1/10 of the height of said optical waveguide device.

2. A heater module according to claim 1, wherein said resin is composed of a grease-like material.

3. A heater module according to claim 1 wherein said heat-transmitting section is constituted by AlN ceramics.

4. A heater module according to claim 1, wherein an electrically insulating layer is disposed between said heat-generating circuit and said-heat-transmitting section.

5. An optical waveguide module comprising:
the heater module according to claim 1; and
a housing accommodating said heater module and said optical waveguide device.

6. A heater module according to claim 2, wherein said heat-transmitting section is constituted by AlN ceramics.

7. A heater module according to claim 6, wherein an electrically insulating layer is disposed between said heat-generating circuit and said-heat-transmitting section.

8. An optical waveguide module comprising:
the heater module according to claim 7; and
a housing accommodating said heater module and said optical waveguide device.

9. An optical waveguide module comprising:
the heater module according to claim 6; and
a housing accommodating said heater module and said optical waveguide device.

10. A heater module according to claim 2, wherein an electrically insulating layer is disposed between said heat-generating circuit and said-heat-transmitting section.

11. An optical waveguide module comprising:
the heater module according to claim 10; and
a housing accommodating said heater module and said optical waveguide device.

12. A heater module according to claim 3, wherein an electrically insulating layer is disposed between said heat-generating circuit and said-heat-transmitting section.

13. An optical waveguide module comprising:
the heater module according to claim 12; and
a housing accommodating said heater module and said optical waveguide device.

14. An optical waveguide module comprising:
the heater module according to claim 2; and
a housing accommodating said heater module and said optical waveguide device.

15. An optical waveguide module comprising:
the heater module according to claim 3; and
a housing accommodating said heater module and said optical waveguide device.

16. An optical waveguide module comprising:
the heater module according to claim 4; and
a housing accommodating said heater module and said optical waveguide device.

17. A heater module for heating an optical waveguide device so as to regulate a temperature of said optical waveguide device, which comprises
a heat-generating circuit adapted to generate heat when energized; and
a heat-transmitting section disposed on an upper face of said heat-generating circuit and the optical waveguide device mounted on the heat-transmitting section, characterized in that:
said heat-transmitting section is formed with a recessed groove portion for mounting said optical waveguide device;
wherein a gaseous medium or a resin is interposed in a space defined between walls of said recessed groove portion and said optical waveguide device; and
wherein said space defined between said walls of said recessed groove portion and said optical waveguide device has a width of at least 0.02 mm but not greater than 1.0 mm.

18. A heater module according to claim 17, wherein said resin is composed of a grease-like material.

19. A heater module according to claim 18, wherein said heat-transmitting section is constituted by AlN ceramics.

20. A heater module according to claim 18, wherein an electrically insulating layer is disposed between said heat-generating circuit and said-heat-transmitting section.

21. A heater module according to claim 19, wherein an electrically insulating is disposed between said heat-generating circuit and said-heat-transmitting section.

22. An optical waveguide module comprising:
the heater module according to claim 20; and
a housing accommodating said heater module and said optical waveguide device.

23. An optical waveguide module comprising:
the heater module according to claim 21; and
a housing accommodating said heater module and said optical waveguide device.

24. An optical waveguide module comprising:
the heater module according to claim 19; and
a housing accommodating said heater module and said optical waveguide device.

25. An optical waveguide module comprising:
the heater module according to claim 18; and
a housing accommodating said heater module and said optical waveguide device.

26. A heater module according to claim 17, wherein said heat-transmitting section is constituted by AlN ceramics.

27. A heater module according to claim 26, wherein an electrically insulating layer is disposed between said heat-generating circuit and said-heat-transmitting section.

28. An optical waveguide module comprising:
the heater module according to claim 27; and
a housing accommodating said heater module and said optical waveguide device.

29. An optical waveguide module comprising:
the heater module according to claim 26; and
a housing accommodating said heater module and said optical waveguide device.

30. A heater module according to claim 17, wherein an electrically insulating layer is disposed between said heat-generating circuit and said-heat-transmitting section.

31. An optical waveguide module comprising:
the heater module according to claim 30; and
a housing accommodating said heater module and said optical waveguide device.

32. An optical waveguide module comprising:
heater according to claim 17; and
housing accommodating said heater module and said optical waveguide device.

* * * * *

UNITED STATES PATENT AND TRADEMARK OFFICE
CERTIFICATE OF CORRECTION

PATENT NO. : 6,618,539 B2
DATED : September 9, 2003
INVENTOR(S) : Hirose et al.

It is certified that error appears in the above-identified patent and that said Letters Patent is hereby corrected as shown below:

Title page,
Item [*] Notice, delete the phrase "by 0" and insert -- by 25 days --

Signed and Sealed this

Nineteenth Day of April, 2005

JON W. DUDAS
*Director of the United States Patent and Trademark Office*